US012684257B2

(12) United States Patent
Lule

(10) Patent No.: US 12,684,257 B2
(45) Date of Patent: Jul. 14, 2026

(54) IMAGE SENSOR WITH REDUCED RESOLUTION AND FULL RESOLUTION

(71) Applicant: STMicroelectronics International N.V., Geneva (CH)

(72) Inventor: Tarek Lule, Saint-Egreve (FR)

(73) Assignee: STMicroelectronics International N.V., Geneva (CH)

( * ) Notice: Subject to any disclaimer, the term of this patent is extended or adjusted under 35 U.S.C. 154(b) by 49 days.

(21) Appl. No.: 18/814,251

(22) Filed: Aug. 23, 2024

(65) Prior Publication Data

US 2025/0081644 A1     Mar. 6, 2025

(30) Foreign Application Priority Data

Aug. 31, 2023     (FR) ...................................... 2309154

(51) Int. Cl.
| | |
|---|---|
| *H04N 25/46* | (2023.01) |
| *H04N 25/42* | (2023.01) |
| *H04N 25/59* | (2023.01) |
| *H04N 25/77* | (2023.01) |
| *H04N 25/771* | (2023.01) |
| *H04N 25/78* | (2023.01) |
| *H10F 39/00* | (2025.01) |

(52) U.S. Cl.
CPC ............. *H04N 25/46* (2023.01); *H04N 25/42* (2023.01); *H04N 25/59* (2023.01); *H04N 25/77* (2023.01); *H04N 25/771* (2023.01);

*H04N 25/78* (2023.01); *H10F 39/8037* (2025.01); *H10F 39/813* (2025.01)

(58) Field of Classification Search
CPC ...... H04N 25/46; H04N 25/77; H04N 25/771; H04N 25/78; H04N 25/42; H04N 25/59; H10F 39/8037; H10F 39/813
See application file for complete search history.

(56) References Cited

U.S. PATENT DOCUMENTS

| | | |
|---|---|---|
| 2018/0098013 A1 | 4/2018 | Yoshida et al. |
| 2021/0144315 A1* | 5/2021 | Yun ........................ H04N 25/42 |
| 2022/0116557 A1* | 4/2022 | Lee ........................ H10F 39/811 |

* cited by examiner

*Primary Examiner* — Nicholas G Giles

(74) *Attorney, Agent, or Firm* — Seed Intellectual Property Law Group LLP

(57)     ABSTRACT

The present disclosure relates to an image sensor comprising an array of pixels arranged in first rows and in first columns. The pixels are arranged in groups of N*N pixels, with N an integer equal to or higher than 2. In each group, the pixels of the group are distributed into one or more sub-groups of a plurality of pixels. Each pixel comprises: a photosensitive element, a first node coupled to the photosensitive element, a second node common to all pixels of a same sub-group, and coupled to a first potential, a first transistor coupling the first and second nodes to each other, a second source-follower transistor having a gate connected to the first node, and a third transistor coupling the source of the third transistor to a reading line.

16 Claims, 3 Drawing Sheets

IMAGE SENSOR WITH REDUCED RESOLUTION AND FULL RESOLUTION

CROSS-REFERENCE TO RELATED APPLICATION(S)

This application claims the priority benefit of French Patent Application N°23/09154 filed on Aug. 31, 2023, entitled "Capteur d'image," which is hereby incorporated by reference to the maximum extent allowable by law.

BACKGROUND

Technical Field

The present description relates generally to electronic circuits, for example integrated electronic circuits, and more particularly to image sensors.

Description of the Related Art

Image sensors comprising an array of pixels arranged in rows and in columns are known. Among these known image sensors, some sensors are configured to alternatively operate according to a first operating mode, corresponding to a reduced resolution mode, and according to a second operating mode, corresponding to a full resolution mode.

In the second operating mode, pixels of the same row are separately and simultaneously read, each read pixel providing an output signal to a different corresponding reading circuit.

In the first operating mode, pixels are arranged in groups of N+N pixels, with N an integer higher than or equal to 2, and when reading the pixels of a given group, the output signals from the pixels of the group are combined, and delivered to a single reading circuit. Thus, in this first operating mode, unused reading circuits can be switched off so that the power consumption of the sensor is reduced.

However, the known image sensors configured to implement the two hereinabove described operating modes have various drawbacks. For example, their power consumption remains too high, even in the first operating mode. For example, the time required to capture a reduced resolution image in the first operating mode is too long.

BRIEF SUMMARY

There is a desire to address some or all of the drawbacks of the known image sensors configured to alternatively operate according to a first operating mode having a reduced resolution, and according to a second operating mode having a full resolution.

One embodiment address some or all of the drawbacks of the known image sensors configured to operate alternatively according to a first operating mode having a reduced resolution, or according to a second operating mode having a full resolution.

One embodiment provides an image sensor comprising an array of pixels arranged in first rows and in first columns, wherein:

the pixels are arranged in groups of N*N pixels, where N is an integer equal to or higher than 2;

in each group, the pixels of the group are distributed into one or more sub-groups of a plurality of pixels;

each pixel comprises:

a photosensitive element, a first node coupled to the photosensitive element, a second node common to all pixels of the same sub-group and coupled to a first potential, a first transistor coupling the first and second nodes to each other, a second source-follower transistor having a gate connected to the first node, and a third transistor coupling the source of the second transistor to a reading line.

According to one embodiment, the sensor further comprises a control circuit configured, in a first operating mode, for each group, to implement a reading of said group by controlling:

the ON state of the first transistor of each pixel of the group, for each sub-group, the ON state of the third transistor of one or more given pixels from the pixels of the sub-group, and the OFF state of the third transistor of all other pixels of the sub-group;

and wherein, in each group, the one or more given pixels of said group have their third transistors connected to the same reading line.

According to one embodiment, in each group, the pixels are distributed into a single sub-group coincident with said group.

According to one embodiment, each sub-group comprises a single given pixel.

According to one embodiment:

the sensor comprises, for each first column, exactly P reading lines associated with said first column, where P is a positive integer; and for each reading line, the sensor comprises a reading circuit connected to the reading line.

According to one embodiment:

the groups are arranged in second rows and in second columns;

the control circuit is configured, in the first operating mode, to implement a simultaneous reading of groups of K second rows, where K is an integer belonging to a range from 2 to N*P; and in each second column, the third transistors of said given pixels of the groups of said K second rows are connected to different reading lines if they belong to different groups.

According to one embodiment, in each first row, all pixels of the row have their third transistors connected to a different reading line.

According to one embodiment, the first rows are arranged in sets of P first rows, and, in each set of P first rows, the third transistors of the pixels of a same first column are connected to different reading lines among the P reading lines associated with said first column.

According to one embodiment, the control circuit is configured, in a second operating mode, in each set of P first rows, to implement a simultaneous reading of the pixels of the P first rows of the set by controlling:

the OFF state of the first transistor of each pixel of each said P first rows of the set, and the ON state of the third transistor of each pixel of each said P first rows of the set.

According to one embodiment, in the second operating mode, for each pixel, the control circuit is configured, for each integration phase by said pixel, to control the OFF state of the first transistor of said pixel.

According to one embodiment:

each pixel further comprises a fourth transistor coupling the second node of said pixel to the first potential, the first potential being an initializing potential; and the control circuit is configured, for each pixel, to implement an initialization of the pixel by simultaneously controlling the ON state of the first and fourth transistors of the pixel.

According to one embodiment, each pixel comprises a transfer gate coupling the first node to the photosensitive element, and the control circuit is configured, for each pixel, to implement the initialization of the pixel by switching ON the transfer gate of the pixel while the first and fourth transistors of the pixel are in the ON state, and preferably, to switch OFF the transfer gate at the end of the initialization of the pixel.

According to one embodiment, in the first operating mode, in each group, the control circuit is configured to implement an initialization of a first part of the pixels of the group, and an initialization of a second part of the pixels of the group ending after the initialization of the first part of the pixels of the group.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, the operations and elements that are useful for an understanding of the embodiments described herein have been illustrated and described in detail. In particular, the usual applications wherein is provided an image sensor configured to alternatively operate according to a first reduced resolution operating mode and according to a second full resolution operating mode, are not described in detail, the described embodiments and variants being compatible with such usual applications Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
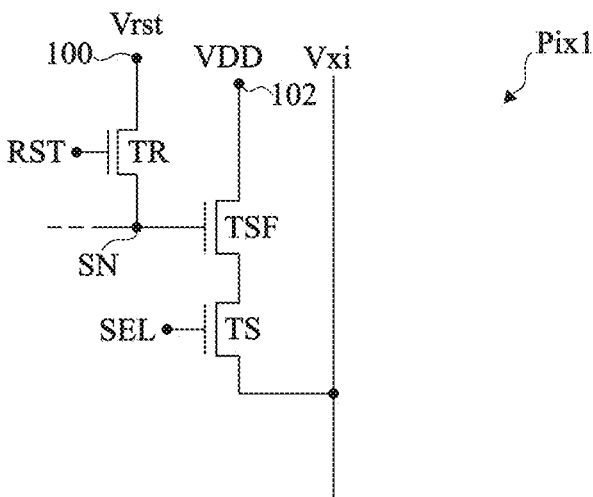
FIG. 1 partially illustrates an example pixel of an image sensor.

FIG. 1 partially and schematically illustrates an example pixel Pix1 of an image sensor.

Pixel Pix1 comprises a photosensitive element (not shown in FIG. 1) coupled, for example connected, to a sensing node SN of the pixel Pix1.

Pixel Pix1 further comprises a MOS (Metal Oxide Semiconductor) transistor TR. Transistor TR is a transistor for initializing the pixel Pix1, and more particularly for initializing the node SN of the pixel Pix1 at an initialization potential Vrst. Transistor TR is connected between the node SN and a node 100 configured to receive the potential Vrst. When the transistor TR is switched ON by a signal RST received on its gate, the node SN is set at the potential Vrst (neglecting the voltage drop across the transistor TR).

Pixel Pix1 further comprises a MOS transistor TSF. Transistor TSF is a source-follower transistor, or in other words is source-follower mounted. The gate of the transistor TSF is connected to the node SN. The drain of the transistor TSF is connected to a node 102 for applying a bias potential VDD. The source of the transistor TSF is coupled to a reading line Vxi through a MOS transistor TS of the pixel Pix1. More particularly, the transistor TS is connected between the source of the transistor TSF and the line Vxi. In this way, when the transistor TS is switched ON by a signal SEL that it receives on its gate, the transistor TSF charges the line Vxi at a potential determined by the potential at the node SN, and conversely when the transistor TS is switched OFF by the signal SEL, the transistor TS electrically isolates the line Vxi from the transistor TSF.

Figure 2:
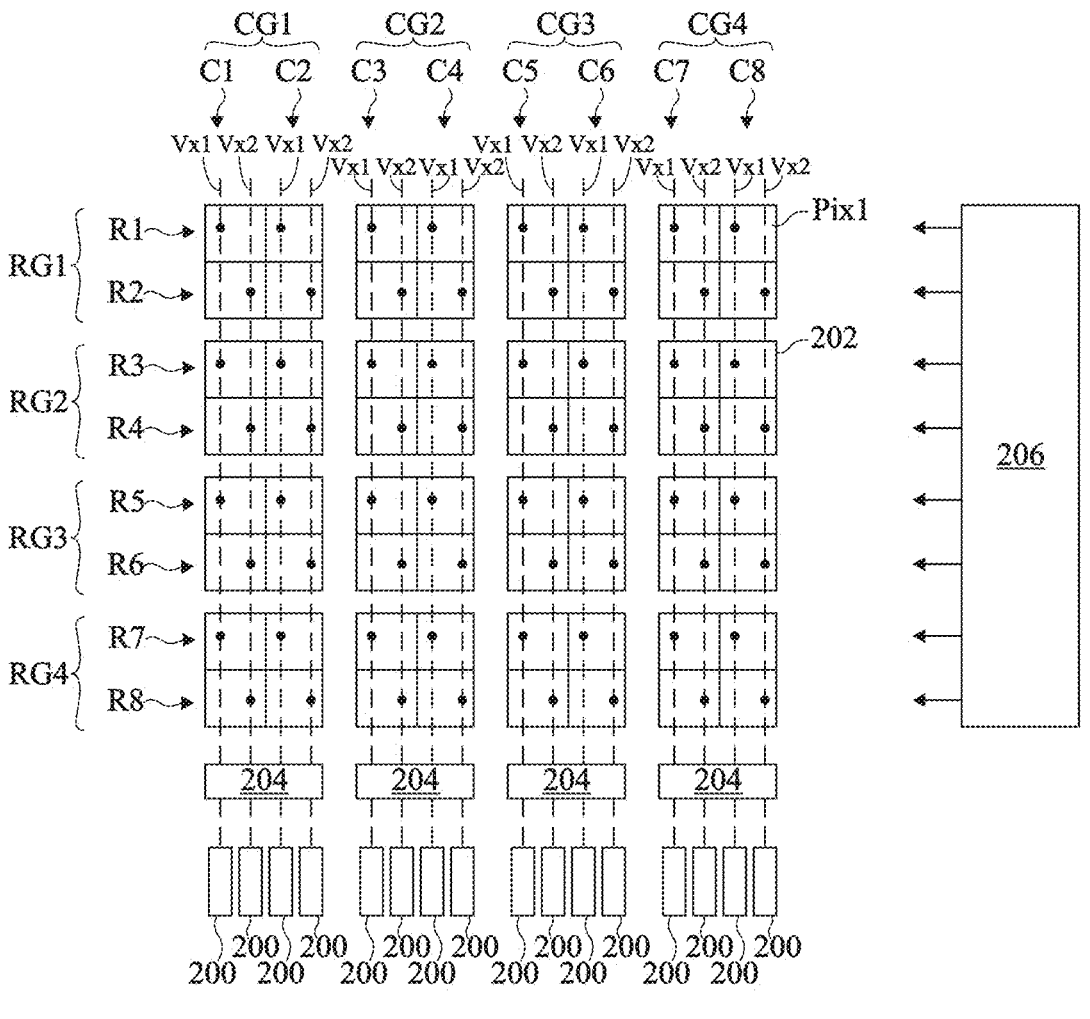
FIG. 2 illustrates an example image sensor implemented with the pixel shown in FIG. 1, and configured to alternatively operate according to a first reduced resolution operating mode, and according to a second full resolution operating mode.

FIG. 2 illustrates an example image sensor 2 implemented with the pixel Pix1 shown in FIG. 1, and configured to alternatively operate according to a first reduced resolution operating mode and according to a second full resolution operating mode. In order not to overburden the figure, one pixel Pix1 is referenced in FIG. 2.

The sensor 2 comprises an array of pixels Pix1 arranged in Nr rows Rq and in Nc columns Cj, with Nr and Nc positive integers higher than 2, q an integer index ranging from 1 to Nr, and j an integer index ranging from 1 to Nc. In the example shown in FIG. 2, Nr is equal to 8, and Nc is equal to 8.

For each column Cj, the sensor 2 comprises exactly P reading lines (or conductive lines) Vxi associated with this column Cj, with P a positive integer, and i an integer index ranging from 1 to P. In the example shown in FIG. 2, P is equal to 2, and each column Cj is associated with two corresponding lines Vx1 and Vx2. In the example shown in FIG. 2, lines Vx1 and Vx2 are drawn with doted lines.

Rows Rq are arranged in sets of exactly P rows Rq, preferably P consecutive rows Rq. Each row Rq belongs to one set of P rows Rq. In the example shown in FIG. 2, P is equal to 2, and each set of P rows Rq comprises a row Rq with an odd index q, and the row Rq+1 with the next index q+1. In other words, in this example, a first set comprises the two rows R1 and R2, a second set comprises the two rows R3 and R4, a third set comprises the two rows R5 and R6, and a fourth set comprises the two rows R7 and R8.

In each set of P rows Rq, the pixels Pix1 of the same column Cj have their transistors TS connected to different lines Vxi from the lines Vxi associated with this column Cj. For example, within the set comprising the two rows R1 and R2, the pixel of the row R1 and column C1 has its transistor TS connected to the line Vx1 associated with the column C1, and the pixel of the row R2 and column C1 has its transistor TS connected to the line Vx2 associated with the column C1. In FIG. 2, in each pixel Pix1, a point is disposed on the line Vxi to which the transistor TS of the pixel Pix1 is connected.

In each row Rq of pixels, all pixels of the row have their transistors TS connected to different lines Vxi.

In the sensor 2, the pixels Pix1 are arranged in groups 202 of N*N pixels Pix1, with N an integer higher than or equal to 2. Each group 202 thus comprises the pixels Pix1 belonging to N consecutive rows Rq and to N consecutive columns Cj. In order not to overburden the drawing, one group 202 of N*N pixels is referenced in FIG. 2. Further, in order to make easier the consultation of the FIG. 2, the sets 202 of N*N pixels Pix1 are separated from each other by gaps, although these gaps could in practice be omitted.

In the example shown in FIG. 2, N is equal to 2, and each group 202 then comprises 4 pixels. For example, the group 202 referenced in FIG. 2 comprises the pixels Pix1 belonging to the N=2 rows R3 and R4, and to the N=2 columns C7 and C8.

The groups 202 of N*N pixels Pix1 are arranged in NGr rows RGm and in NGc columns CGn, with NGr and NGc positive integers higher than 2, m an integer index from 1 to NGr, and n an integer index from 1 to NGc. More particularly, NGr is equal to Nr/N and NGc is equal to Nc/N. In other words, the sensor 2 comprises an array of groups 202 of N*N pixels Pix1 arranged in NGr rows RGm and in NGc columns CGn so as to form an array of Nr=N*NGr rows Rq, and Nc=N*NGc columns Cj of pixels Pix1. In the example shown in FIG. 2, NGr is equal to 4, and NGc is equal to 4, and the sensor 2 comprises NGr*NGc=16 groups 202 of 4*4 pixels Pix1, the 16 groups 202 being arranged in NGr=4 rows RG1, RG2, RG3, and RG4 of groups 202, and in NGc=4 columns CG1, CG2, CG3, and CG4 of groups 202.

The sensor 2 comprises, for each reading line Vxi, a reading circuit 200 associated with this reading line.

The sensor 2 also comprises NGc circuits 204 for routing the lines Vxi towards the circuits 200.

More particularly, for each column CGn of groups 202, the sensor 2 comprises a circuit 204 associated with this column CGn. Each circuit 204 is connected, for example has inputs connected, to the lines Vxi associated with those columns Cj having pixels Pix1 being part of the groups 202 of this column CGn. For example, the circuit 204 associated with the column CG1 is connected to the lines Vx1 and Vx2 associated with the columns C1 and C2, the columns C1 and C2 having their pixels Px1 being part of the groups 202 of the column CG1.

Further, each circuit 204 is connected, for example has outputs connected, to those reading circuits 200 being associated with the lines Vxi to which this circuit 204 is connected.

Sensor 2 comprises a control circuit 206 configured to control the circuits 204 and the pixels Pix1.

In an operating mode with full resolution, the circuit 206 controls the circuits 204 so that each reading line Vxi is electrically coupled to the circuit 200 with which it is associated. In this operating mode, at each reading of a row Rq of pixels Pix1, all pixels Pix1 of the row are simultaneously read. Further, in this operating mode, the sets of P rows Rq are read one after the other, and, during the reading of each set of P rows Rq of pixels Pix1, the P rows Rq of the set are simultaneously read. In other words, the sets of P rows Rq are read one after the other, and the reading of each set of P rows Rq comprises the simultaneous reading of all pixels Pix1 being part of the P rows Rq of this set. To read a pixel Pix1, the circuit 206 controls the switching ON of the transistor TS of the pixel with the signal SEL corresponding to this transistor.

For example, in FIG. 2 where P is equal to 2, in a full resolution operating, the P=2 rows R1 and R2 are simultaneously read, all pixels Pix 1 of these P=2 rows R1 and R2 being thus simultaneously read, and then the P=2 rows R3 and R4 are simultaneously read, all pixels Pix 1 of these P=2 rows R3 and R4 being thus simultaneously read, and then the P=2 rows R5 and R6 are simultaneously read, all pixels Pix 1 of these P=2 rows R5 and R6 being thus simultaneously read, and lastly the P=2 rows R7 and R8 are simultaneously read, all pixels Pix 1 of these P=2 rows R7 and R8 being thus simultaneously read.

In an operating mode with reduced resolution, the circuit 206 controls the circuits 204 so that, for each circuit 204, the lines Vxi connected to this circuit 204 are all electrically coupled to one of the circuits 200 connected to the circuit 204. In this operating mode, reading a group 202 comprises delivering the output signals of the pixels Pix1 of this group to a corresponding circuit 204 where these signals are combined with each other before being delivered to a single reading circuit. Particularly, reading a group 202 of pixels Pix1 comprises switching ON the transistors TS of all pixels Pix of this group. In this operating mode, the rows RGm of groups 202 of pixels Pix1 are read one after the other, reading a row RGm corresponding to simultaneously reading all groups 202 of this row.

For example, in FIG. 2 where P is equal to 2, in a reduced resolution operating mode, the row RG1 of groups 202 of pixels Pix1 is read by switching ON the transistors TS of all pixels Pix1 of the groups 202 belonging to this row RG1, then the row RG2 of groups 202 of pixels Pix1 is read by switching ON the transistors TS of all pixels Pix1 of the groups 202 belonging to this row RG2, then the row RG3 of groups 202 of pixels Pix1 is read by switching ON the transistors TS of all pixels Pix1 of the groups 202 belonging to this row RG3, and lastly the row RG4 of groups 202 of pixels Pix1 is read by switching ON the transistors TS of all pixels Pix1 of the groups 202 belonging to this row RG4.

In reduced resolution operating mode, since each circuit 204 provides a signal to a single one of the circuits 200 to which it is connected, the other circuits 200 to which the circuit 204 is connected, and to which the circuit 204 does not provide any signal, can be switched off, which allows the power consumption to be reduced. However, since reading the groups 202 is performed one row RGm after the other, the time period for reading all groups 202 of N*N pixels Pix1 of the sensor 2 is long. However, the longer this time period for reading the groups 202, the higher the power consumption of the sensor 2. Further, when this reading time period is long, the sensor 2 is no more able to acquire nor provide images at a frame per second (fps) rate sufficient for some applications.

For example, a sensor 2 comprising Nr=320 rows of pixels Pix1 and Nc=320 columns of pixels Pix1 consumes sensibly 20 mW with an acquisition rate of 30 frame per second in full resolution. In a reduced resolution mode with groups 202 of 10*10 pixels Pix1 (N being equal to 10), this sensor 2 is however not able to acquire images at a frame per second rate equal to or higher than 5 while consuming less than 10 μW, which is desirable by some applications.

It is herein provided in a reduced resolution operating mode, to take advantage of the circuits 200 of the sensor 2 that are unused and switched off. Indeed, it is provided a sensor similar as the sensor 2, wherein in reduced resolution operating mode, during each reading of all groups 202 of N*N pixels, the reading circuits 200 are all let switched on, and are then used to simultaneously read several rows RGm of groups 202 of N*N pixels.

Letting all circuits 200 switched on during the reading of all groups 202 in reduced resolution operating mode seems opposite to the low-power target.

However, it allows, in reduced resolution operating mode, the time to read all groups of N*N pixels to be reduced. Thus, in reduced resolution operating mode, for an aimed frame per second rate, it results in the time period between each two consecutive readings of all groups of N*N pixels being increased. Between each two consecutive reading of all N*N pixels groups, the reading circuits 200 and preferably all peripherals used to operate these reading circuits (voltage regulators, image processing circuits receiving the outputs from the circuits 200, the circuits for generating a timing clock for the circuits 200) can then be switched off, or set in sleep mode to reduce the power consumption.

For example, to acquire five frames per second in low resolution mode with a sensor having a sensor of 320*320 pixels arranged in groups of 10*10 pixels, a sensor has 200 ms to acquire an image and, when this sensor is as provided, it takes for example 20 us or less to read all groups 202. That means that for each acquired low resolution image, the circuits 200, and preferably their peripherals, can be switched off or set in sleep mode during 199.98 ms, which allows the power consumption of the sensor to be reduced at less than 10 u W for each acquired low resolution image.

In order to implement the hereinabove described operation, one provides a pixel and a sensor implemented with this pixel.

Figure 3:
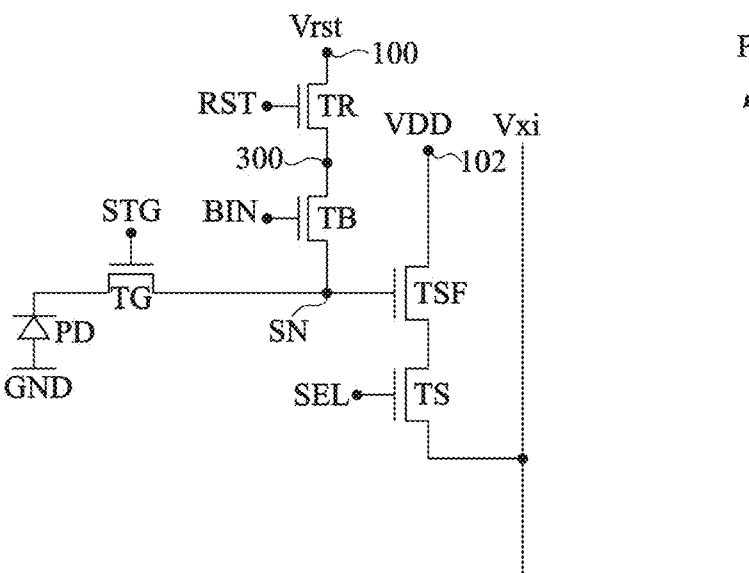
FIG. 3 illustrates an embodiment of a pixel of an image sensor.

FIG. 3 illustrates an example embodiment of such a pixel Pix3.

Pixel Pix3 comprises numerous elements in common with pixel Pix1, and the differences between these pixels are herein described in detail.

Particularly, pixel Pix3 differs from pixel Pix1 in that it comprises a MOS transistor TB connected between the node SN and a node 300, and in that the transistor TR of the pixel Pix3 is connected between the node 300 and the node 100 receiving the potential Vrst. The transistor TB is controlled by a signal BIN it receives on its gate.

When the pixels Pix3 are arranged in groups 202 of N*N pixels Pix3 for a low resolution operation, node 300 is in common with, and single for, all pixels Pix3 of the same group 202. Particularly, each group 202 of pixels Pix3 comprises its own node 300 being preferably different from the nodes 300 of the other pixel groups 202.

Thus, switching the transistor TB ON, as the transistor TR is OFF, all pixels Pix3 of a same group 202 of N*N pixels Pix3 share the same node 300 at which is present, upon reading the group of pixels Pix3, a voltage representative of the light quantity received by the pixels Pix3 of this group. It is thus no more required to provide a circuit 204 to combine the output signals of the pixels.

In the example shown in FIG. 3, the photodetector PD, for example a photodiode being pinned or not, of the pixel Pix3 is illustrated. As indicated in relation to FIG. 2, this photodetector PD is coupled to the node SN of the pixel Pix3.

More particularly, as illustrated in FIG. 3, the pixel Pix3 for example comprises a transfer gate TG coupling the node SN to the photodetector PD, the gate TG for example being connected between the node SN and the photodetector PD. The gate TG is controlled by a signal STG.

In another non-illustrated example, the pixel Pix3 is free of gate TG, and the node SN is connected to the photodetector PD.

Figure 4:
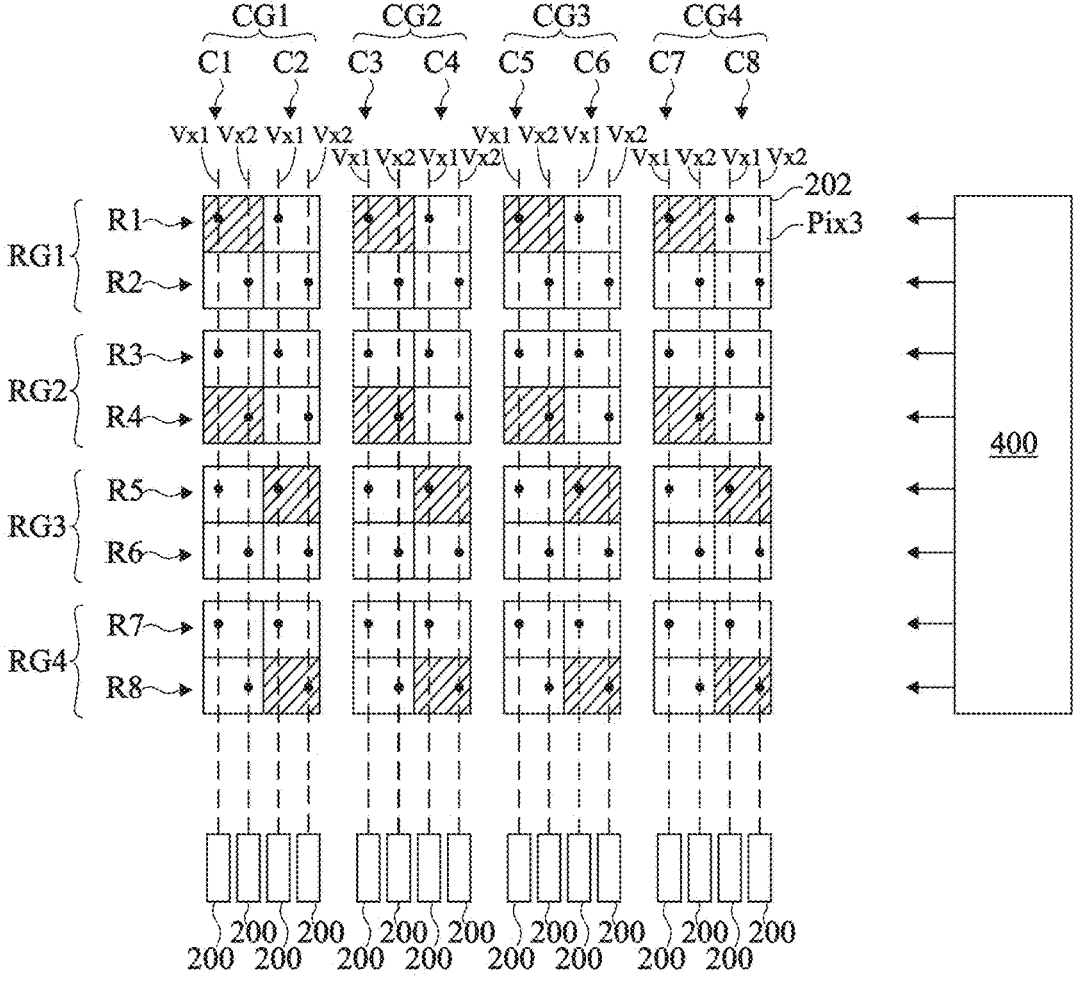
FIG. 4 illustrates an embodiment of an image sensor implemented with the pixel shown in FIG. 3, and configured to alternatively operate according to a first reduced resolution operating mode, and according to a second full resolution operating mode.

FIG. 4 illustrates an example embodiment of an image sensor 4 implemented with the pixel Pix3 previously described, and configured to alternatively operate according to a first reduced resolution operating mode and according to a second full resolution operating mode.

Sensor 4 comprises numerous elements in common with sensor 1, and the differences between these two sensors are herein described in detail. Thus, unless specified otherwise, all that were explained for the sensor 2 described in relation to FIG. 2 applies to the sensor 4 described in relation to FIG. 4.

Particularly, as compared to the sensor 2, pixels Pix1 are replaced with pixels Pix3, a single pixel Pix3 being referenced in FIG. 4, in order not to overburden the figure.

Further, the sensor 4 is free of circuit 204. Thus, each line Vxi is connected to the circuit 200 with which it is associated. Removing the circuits 204 allows the fingerprint of the sensor 4 to be reduced as compared with that of sensor 2. Further, the circuits 204 being typically implemented by switches triggering their state when the sensor modifies its operating mode then causing switching leakages, removing circuits 204 also allows the power consumption to be reduced, and the linearity of the sensor 4 to be increased with respect to the sensor 2.

The control circuit 206 of the sensor 2 is replaced with a control circuit 400 in the sensor 4. This circuit 400 is configured to provide the signals SEL, BIN, and RST to the pixels Pix3, and the signals STG when these pixels comprise each a transfer gate TG. Of course, the signals SEL provided to the pixels by the circuit 400 can be different between two pixels. For example, a pixel could receive a signal SEL controlling the switching ON of its transistor TS, while another pixel simultaneously receives a signal SEL controlling the switching OFF of its transistor TS.

Particularly, in a low resolution operating mode, for each group 202 of N*N pixels Pix3, the circuit 400 is configured to implement a reading of the group by controlling the ON state of the transistor TB of each pixel Pix3 of the group, so that they share the node 300 (FIG. 3), and by simultaneously controlling the ON state of the transistor TS of a given single pixel Pix3 of the group 202, and the OFF state of the transistors TS of the other pixels Pix3 of the group. Thus, it is this given pixel Pix3 that will deliver the output signal of the group 202 of pixels Pix3 over the line Vx to which the transistor TS of this given pixel Pix3 is connected. In each group 202, this given pixel Pix3 the transistor TS of which is switched ON when reading the group is for example called reading pixel of the group 202, and is hashed in FIG. 4. In other words, in low resolution operating mode, for each group, the circuit 400 is configured to implement a reading of said group by providing a signal SEL to the reading pixel of the group being different from the signal SEL provided to all other pixels of the group, where this different signal SEL can be seen as a signal SEL'.

As an example, when the pixels Pix3 comprise a transfer gate TG as was described in relation to FIG. 3, before reading a group 202 of pixels Pix3, the gate TG of each pixel Pix3 of the group is switched ON so that the potential of the node 300 is determined by the quantity of light received by the photodetectors PD of these pixels Pix3, and then switched back OFF before reading the group 202.

In other examples where the pixels Pix3 are free of gate TG, this switching ON of the gates TG before reading is of course omitted.

In the sensor 4, as in the sensor 2, for each column Cj, the sensor comprises P conductive reading lines Vxi associated with this column Cj. Further, the rows Rq are arranged in sets of exactly P rows Rq, preferably P consecutive rows Rq, each row Rq belonging to one set of P rows Rq. In each set of P rows Rq, the pixels Pix3 of the same column Cj have their transistors TS connected to different lines Vxi of the lines Vxi associated with this column Cj.

In FIG. 4, for each pixel Pix3, connecting the transistor TS of the pixel Pix3 to a corresponding line Vxi is illustrated by a point located in the pixel and on this line Vxi. For example, the pixel Pix3 located at top left corner in FIG. 4 has its transistor TS connected to the line Vx1 associated with the column C1 including this pixel Pix3.

In the sensor 4, the circuit 400 is configured in low resolution operating mode, to implement a simultaneous reading of the groups 202 of K rows RGm of groups 202, with K an integer belonging to a range from 2 to N*P. In order to simultaneously read these K rows RGm, in each column CGn of groups 202 of N*N pixels Pix3, the reading pixels Pix3 (hashed in FIG. 4) of the groups 202 belonging to these K rows RGm are connected to different lines Vxi.

As an example, in FIG. 4, the circuit 400 is configured to read simultaneously K=2*2=4 rows RGn, i.e., to read simultaneously the four rows RG1, RG2, RG3, and RG4. Thus, in each column CGn, the group reading pixels Pix3 (hashed in FIG. 4) belonging to this column CGn and also to either one of the rows RG1, RG2, RG3, and RG4 have their transistors TS connected to different lines Vxi. For example, as illustrated in FIG. 4:

the reading pixel Pix3 of the group 202 of the column CG1 and of the row RG1 belongs to the column C1, and is connected to the line Vx1 associated with this column C1;

the reading pixel Pix3 of the group 202 of the column CG1 and of the row RG2 belongs to the column C1, and is connected to the line Vx2 associated with this column C1;

the reading pixel Pix3 of the group 202 of the column CG1 and of the row RG3 belongs to the column C2, and is connected to the line Vx1 associated with this column C2; and the reading pixel Pix3 of the group 202 of the column CG1 and of the row RG4 belongs to the column C2, and is connected to the line Vx2 associated with this column C2.

Of course, those skilled in the art will be able, based on the description provided herein for the sensor 4, to provide other example arrangements of the reading pixels Pix3 of the groups 202 and/or other example connections of the reading pixels Pix3 of the groups 202 to the lines Vxi of the sensor.

Although in the hereinabove example all rows RGm are simultaneously read, in another example where the sensor 4 comprises one line Vxi per column Cj, the circuit 400 is then configured to read simultaneously K=2*1=2 rows RGm in a first step, and simultaneously the 2 other rows RGm in a second step, reading all groups 202 being thus performed in two consecutive steps.

However, the number P of lines Vxi per column Cj, and the number N are preferably determined, for a sensor 4 comprising a given number of pixels Pix3, so that N*P is equal to NGr and, for example, the numbers Nr/N and Nc/N are integers. The circuit 400 can then preferably be configured to simultaneously read the NGr rows of groups 202 in low resolution operating mode.

The circuit 400 is further configured in full resolution operating mode to read the sets of P rows Rq one after the other, reading each set of P rows Rq corresponding to simultaneously reading all pixels Pix3 of the P rows Rq of this set. In other words, in full resolution operating mode in each set of P rows Rq of pixels Pix3, the circuit 400 is configured to implement a simultaneous reading of the pixels Pix3 of the P rows Rq of this set.

Particularly, in full resolution operating mode, for each set of P rows Rq of pixels Pix3, the circuit 400 implements a simultaneous reading of the pixels of the P rows Rq of the set, by controlling:

the OFF state of the transistor TB of each of these pixels Pix3, so that the node SN of the pixel is isolated from the node 300 common to all pixels Pix3 of the group 202 to which belongs this pixel Pix3, thereby during the reading of the pixel Pix3, the potential of the node SN of the pixel Pix3 is determined by the quantity of light received by the photodetector PD of this pixel Pix3; and the ON state of the transistor TS of each of these pixels Pix3, so that each pixel Pix3 charges the line Vxi to which is connected its transistor TS to a potential determined by the potential of the node SN of this pixel Pix3.

As an example, by taking up the differentiation between the signals SEL' received by the reading pixels of the groups 202 and the signals SEL received by all other pixels, in full resolution operating mode, when a row Rq is read, each reading pixel being part of this row Rq receives a signal SEL' identical to the signal SEL received by each other pixels of this row Rq, namely signals SEL and SEL' controlling the switching ON of the transistors TS receiving these signals.

Usually in the image sensors, the circuit 400 is configured to implement an initialization of each pixel Pix3 of the sensor 3, i.e., an initialization of the node SN of each pixel Pix3 to the potential Vrst.

As an example, for each pixel Pix3 in the sensor 4, the circuit 400 initiates the potential of the node SN to the potential Vrst not only by controlling the ON state of the transistor TR of the pixel Pix3, but also by simultaneously controlling the ON state of the transistor TB of this pixel and the ON state of its transistor TR. This initialization phase also allows the potential at the node 300 to be initialized at the potential Vrst. Preferably, in the full resolution operating mode, the transistor TR can be permanently let at the ON state, so that the node 300 does not float.

As an example, when the pixels Pix3 comprise each a transfer gate TG, the latter can be switched ON then OFF during an initialization of the pixel Pix3, so that the photodetector PD is also initialized, for example by draining the photogenerated charges that are there, and that are evacuated towards the node 102. Switching OFF the gate TG of the pixel Pix3 thus marks the start of an integration phase by this pixel Pix3.

According to one embodiment, considering again the previous example of pixels Pix3 provided with gates TG, in each group 202, in the low resolution operating mode, all pixels Pix3 of the group integer the light they receive during a time period common to all these pixels. In other words, in the low resolution operating mode, in each group 202, integrating the light by the pixels Pix3 of the group 202 simultaneously starts in all pixels Pix3 of the group, and simultaneously ends in all pixels Pix3 of the group.

According to one alternative embodiment, considering again the previous example of pixels Pix3 provided with gates TG, in each group 202, in low resolution operating mode, a part of the pixels Pix3 of the group is initialized, then the other part of the pixels Pix3 of the group is initialized. For example, all pixels of the group are simultaneously initialized, then initializing ends for a first part of the pixels Pix3 of the group while it goes on for the second part of the pixels Pix3 of this group, and initializing the second part of the pixels Pix3 of the group ends at a time subsequent to initializing the first part of the pixels Pix3 of the group.

Providing the initialization end at different times for two parts of the pixels Pix3 of a group 202 allows the integration duration of the pixels Pix3 the initialization of which was ended earlier to be longer than the integration duration of the pixels Pix3 the initialization of which was ended later. For example, this allows obtaining an operation so-called "high dynamic range," or HDR.

One advantage of implementing the HDR mode in low resolution operating mode is there is no need to provide any processing circuit to combine the output signals of the pixels Pix3 having a shorter integration duration and the output signals of the pixels Pix3 having a longer integration duration, this combination being directly performed on the node 300 during the reading phase.

Naturally, although the HDR mode in the second operating mode has been described for an example where, in each group 202, the group pixels are arranged in two parts having each a different integration duration, those skilled in the art will be able based on the description provided hereinabove to adapt this example to the case where, in each group 202, the group pixels are arranged in more than two parts having each a different integration duration.

As an alternative example, when the pixels Pix3 are each free of gate TG, in each pixel Pix3, initializing the node SN of the pixel Pix3 by the simultaneous ON state of both transistors TR and TB also allows initializing the photodetector PD of this pixel Pix3. In such case, in each pixel Pix3, switching OFF the transistor TB of the pixel Pix3 marks the end of initializing the pixel, and the start of an integration phase by this pixel in full resolution operating mode. Further, in each group 202, simultaneously switching OFF transistors TR of the pixels Pix3 of the group marks the end of initializing the pixels Pix3 of the group 202, and the start of an integration phase by the group 202.

Reverting to the hereinabove example where the pixels Pix3 are each free of gate TG, in full resolution operating mode, for each pixel Pix3, when the pixel Pix3 is in an integration phase, for example an integration phase starting with the end of initializing the pixel, and ending upon reading this pixel Pix3, the circuit 400 is configured to control the OFF state of the transistor TB of the pixel. Thus, the light received by this pixel Pix3 during this integration phase determines the potential of the node SN upon reading the pixel, or in other words, the light received by other pixels Pix3 sharing the same node 300 does not impact the potential of the node SN of this pixel.

As an example, when the pixels Pix3 comprise each a gate TG, during the integration phase of each pixel Pix3, in full resolution operating mode, the transistor TB of the pixel is preferably let at the OFF state, although it could also be let at the ON state until the time when the gate TG is consecutively switched ON, and then OFF to end the integration.

As an example, when the pixels Pix3 comprise each a gate TG, during the integration phase of each pixel Pix3, in low resolution operating mode, the transistor TB of the pixel is preferably let at the ON state, although it could also be let at the OFF state until reading this pixel Pix3, i.e., until reading the group of pixels including this pixel Pix3.

As an example, when the pixels Pix3 are each free of gate TG, during the integration phase of each pixel Pix3, in full resolution operating mode, the transistor TB of the pixel is let at the OFF state.

As an example, when the pixels Pix3 are each free of gate TG, during the integration phase of each pixel Pix3, in low resolution operating mode, the transistor TB of the pixel is preferably let at the ON state, although it could also be let at the OFF state until reading this pixel Pix3, i.e., until reading the group of pixels including this pixel Pix3.

In the example sensor 4 described in relation to FIG. 4, Nr is equal to 8, Nc is equal to 8, P is equal to 2, and N is equal to 2.

Hereinafter Table 1 lists other example sensors 4. Particularly, in this Table 1, the first column indicates the number of the example, the second column indicates the total number $Nr*Nc$ of pixels Pix3 of the sensor also corresponding to the resolution of the sensor when it operates in full resolution operating mode, the third column indicates the number N, the fourth column indicates the total number $NGr*NGc$ of groups 202 of $N*N$ pixels Pix3 also corresponding to the resolution of the sensor when it operates in reduced resolution operating mode, the fifth column indicates the number P of lines Vxi per column Cj, the sixth column indicates the total number of circuits 200 of the sensor, and the seventh column indicates the maximum value Kmax $(N*P)$ of the number K of simultaneously readable rows RGm of groups 202.

TABLE 1

|   | Nr*Nc | N | NGr*NGc | P |  | Kmax |
|---|-------|---|---------|---|------|------|
| 1 | 300*300 | 10 | 30*30 | 3 | 900 | 30 |
| 2 | 320*320 | 10 | 32*32 | 3 | 960 | 30 |
| 3 | 320*320 | 10 | 32*32 | 2 | 640 | 20 |
| 4 | 324*324 | 9 | 36*36 | 2 | 648 | 18 |
| 5 | 363*363 | 11 | 33*33 | 3 | 1089 | 33 |

In example 1 of the hereinabove Table 1, the sensor comprises NGr=30 rows RGm of groups 202 of 30*30 pixels Pix3, and the maximum value Kmax of simultaneously readable rows RGm is equal to 30. Thus, the circuit 400 is able to implement a simultaneous reading of all rows RGm of the sensor.

In example 2 of the hereinabove Table 1, the sensor comprises NGr=32 rows RGm of groups 202 of 32*32 pixels Pix3, and the maximum value Kmax of simultaneously readable rows RGm is equal to 30. Thus, the circuit 400 is able to implement a simultaneous reading of 30 rows RGm of the sensor in a first step, and should then implement the simultaneous reading of the 2 remaining rows RGm in a second step. During this second step, 32*2=64 circuits 200 are used, and the unused circuits 200 can be switched off to reduce the power consumption.

In example 3 of the hereinabove Table 1, the sensor comprises NGr=32 rows RGm of groups 202 of 32*32 pixels Pix3, and the maximum value Kmax of simultaneously readable rows RGm is equal to 20. Thus, the circuit 400 is able to implement a simultaneous reading of 20 rows RGm of the sensor in a first step, and should then implement the simultaneous reading of the 12 remaining rows RGm in a second step. During this second step, 32*12=384 circuits 200 are used, and the unused circuits 200 can be switched off to reduce the power consumption.

In example 4 of the hereinabove Table 1, the sensor comprises NGr=36 rows RGm of groups 202 of 9*9 pixels Pix3, and the maximum value Kmax of simultaneously readable rows RGm is equal to 18. Thus, the circuit 400 is able to implement a simultaneous reading of 18 rows RGm of the sensor in a first step, and should then implement the simultaneous reading of the 18 remaining rows RGm in a second step.

In example 5 of the hereinabove Table 1, the sensor comprises NGr=33 rows RGm of groups 202 of 11*11 pixels Pix3, and the maximum value Kmax of simultaneously readable rows RGm is equal to 33. Thus, the circuit 400 is able to implement a simultaneous reading of the 33 rows RGm of the sensor in a single step.

As an example, to capture five low resolution frames per second, the sensor has 200 ms to capture each frame, and particularly to read all groups 202 of the sensor. Considering that for each group 202 reading the group takes 20 μs, then for each acquisition of a low resolution image:

the circuits 200 of the sensor 4 in example 1 of Table 1 can be switched off during 199.98 ms while those of a sensor 2 comprising the same number of pixels, the same number of groups 202, and the same number of lines Vxi per column Cj as this sensor 4 can be switched off in 199.4 ms;

the circuits 200 of the sensor 4 in example 2 of Table 1 can be switched off during 199.96 ms (even during 199.98 ms for 960−64=896 of them) while those of a sensor 2 comprising the same number of pixels, the same number of groups 202, and the same number of lines Vxi per column Cj as this sensor 4 can be switched off in 199.36 ms;

the circuits 200 of the sensor 4 in example 3 of Table 1 can be switched off during 199.96 ms (even during 199.98 ms for 640−384=256 of them) while those of a sensor 2 comprising the same number of pixels, the same number of groups 202, and the same number of lines Vxi per column Cj as this sensor 4 can be switched off in 199.36 ms;

the circuits 200 of the sensor 4 in example 4 of Table 1 can be switched off during 199.96 ms while those of a sensor 2 comprising the same number of pixels, the same number of groups 202, and the same number of lines Vxi per column Cj as this sensor 4 can be switched off in 199.28 ms; and the circuits 200 of the sensor 4 in example 5 of Table 1 can be switched off during 199.98 ms while those of a sensor 2 comprising the same number of pixels, the same number of groups 202, and the same number of lines Vxi per column Cj as this sensor 4 can be switched off in 199.34 ms.

Although it was not explicitly indicated in the hereinabove description, in each group 202 of pixels Pix3, the node 300 common to pixels Pix3 of the group 202 is separate from the nodes 300 of the pixels Pix3 of the other groups 202.

Figure 5:
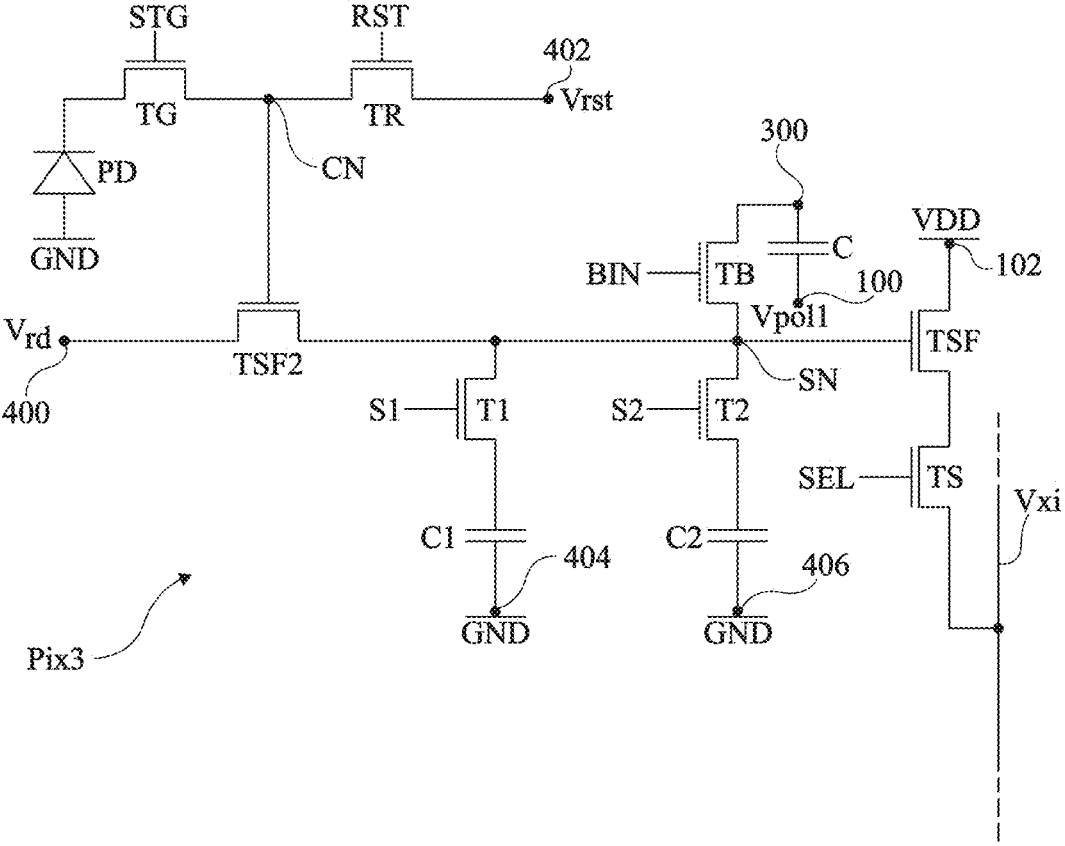
FIG. 5 illustrates another embodiment of a pixel of an image sensor.

FIG. 5 illustrates another embodiment of a pixel Pix3 of the image sensor 4.

The differences between the pixel Pix3 shown in FIG. 3 and that shown in FIG. 5 are herein highlighted.

Particularly, in this alternative embodiment, the node 300 of the pixel Pix3 is not coupled to the node 100 through the transistor TR, but through a capacitive element C, and the node 100 further does not receive the potential Vrst, but a bias voltage Vpo11.

Further, in this embodiment, the node SN of the pixel Pix3 is coupled to the photodetector PD of the pixel through the transfer gate TG and through a source-follower-mounted transistor TSF2. More particularly, the gate TG is connected between the photodetector PD and a node CN, and the transistor TSF2 has its source connected to the node SN, and its gate connected to the node CN. The drain of the transistor TSF2 is connected to a node 400 configured to receive a potential Vrd.

The pixel Pix3 of the embodiment shown in FIG. 5 comprises, like the pixel Pix3 of the embodiment shown in FIG. 3, a transistor TR controlled by a signal RST. However, in FIG. 5, this transistor TR is connected between the node CN and a node 402 configured to receive the potential Vrst.

The pixel Pix3 shown in FIG. 5 comprises a switch T1 controlled by a signal S1, and a capacitive element C1 in series with the switch T1 between the node SN and a node 404 configured to receive a potential, for example a reference potential GND, for example ground. The switch T1 is connected between the node SN and the element C1. The pixel Pix3 shown in FIG. 5 also comprises a switch T2 controlled by a signal S2, and a capacitive element C2 in series with the switch T2 between the node SN and a node 406 configured to receive a potential, for example the reference potential GND. The switch T2 is connected between the node SN and the element C2.

The operation of the sensor 3 in the case where the pixels Pix3 are implemented the way described in relation to FIG. 5 is in the scope of those skilled in the art based on the present description and on their general knowledge. Particularly, all that was exposed relative to controlling the transistors TB and TS of the pixels Pix3 shown in FIG. 3 during a reading phase of the low resolution operating mode, and during a reading phase of the full resolution operating mode applies to the pixel Pix3 shown in FIG. 5.

More generally, those skilled in the art will be able to adapt the present description to yet further example pixels Pix3 as soon as these pixels Pix3 comprise:

a follower-source transistor TSF having its gate connected to a node SN coupled to a photodetector PD of the pixel.

In the hereinabove described embodiments and variants, each group 202 comprises one reading pixel Pix3 having its transistor TS being switched ON during a reading of this group 202.

In alternative embodiments, each group 202 comprises several group reading pixels Pix3 that all are connected to the same reading line Vxi. This can be the case, for example, when the number N is equal to D*P, with D an integer higher than or equal to 2, due to the fact that each group then comprises D pixels Pix3 connected to each of the lines Vxi associated with the columns Cj comprising pixels Pix3 of this group. In this case, in low resolution operating mode, for each group 202, reading the group 202 comprises switching ON, by the control circuit 400, the transistors TS of the reading pixels Pix3 of the group, and the switching OFF, by the control circuit 400, of all other pixels Pix3 of the group 202. In this case, during the reading of the group, there are D ON-transistors TS parallel-connected to each other to a same line Vxi, that allows the reading noise to be reduced, and the signal dynamic on the line Vxi to be increased.

In the hereinabove described embodiments and variants, in each group, all pixels Pix3 of the group share a same node 300.

In alternative embodiments where each group 202 comprises several reading pixels Pix3 of the group being all connected to a same reading line Vxi, in each group 202, the pixels are distributed into several sub-groups of several pixels. In each sub-group, the pixels Pix3 of the sub-group share the same node 300 being common to all pixels Pix3 of the sub-group, but separate from the node 300 of each of the other sub-groups. Each sub-group further comprises at least one of the reading pixels Pix3 of the group 202 to which this sub-group belongs. In this case, in low resolution operating mode, for each group 202, reading the group 202 comprises switching ON, by the control circuit 400 of the transistors TS, the reading pixels Pix3 of the group, and switching OFF, by the control circuit 400, all other pixels Pix3 of the group 202. Thus, when reading the group, in each sub-group, the reading pixel(s) Pix3 of the group tend to impose the potential on the line Vxi to which the ON transistors TS of these reading pixels of the group are connected, according to the potential present on the node 300 of this sub-group. Since in each sub-group of a same group 202, the group reading pixel(s) belonging to this sub-group can boost the potential of the line Vxi, the sub-group(s) of the group having faults, for example white pixels, and having then their nodes 300 pull to the ground GND, cannot pull the potential of the line Vxi to ground. It follows that for each group 202, during reading the group 202, the potential of the line Vxi on which the output signal of the group is read, is determined by the sub-groups of the group 202 that have no fault, which allows the sub-groups of the group 202 having fault to be removed (or filtered).

One should note that the case where in each group 202, all pixels Pix3 of the group share the same node 300 is a specific case of the hereinabove described alternative embodiment, this specific case corresponding to the case where each group 202 comprises a single sub-group coincident with this group 202.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove. In particular, although it was not described in detail, those skilled in the art will be able based on the present description to implement a circuit configured to switch off in low resolution operating mode, the circuits 200 of the sensor 4, and preferably their peripherals, when these circuits 200 are unused.

An image sensor (4) may be summarized as including an array of pixels (Pix3) arranged in first rows (R1, R8) and in first columns (C1, C8), wherein: the pixels are arranged in groups (202) of N*N pixels, where N is an integer equal to or higher than 2; in each group, the pixels of the group are distributed into one or more sub-groups of a plurality of pixels; each pixel comprises: a photosensitive element (PD), a first node (SN) coupled to the photosensitive element, a second node (300) common to all pixels of a same sub-group, and coupled to a first potential, a first transistor (TB) coupling the first and second nodes (SN; 300) to each other, a second source-follower transistor (TSF) having a gate connected to the first node (SN), and a third transistor (TS) coupling the source of the second transistor (TSF) to a reading line (Vxi, Vx1, Vx2).

The sensor (4) may further include a control circuit (400) configured, in a first operating mode, for each group (202), to implement a reading of said group by controlling: the ON state of the first transistor (TB) of each pixel (Pix3) of the group (202), for each sub-group, the ON state of the third transistor (TS) of one or more given pixels (Pix3) from the pixels of the sub-group (202), and the OFF state of the third transistor (TS) of all other pixels (Pix3) of the sub-group (202); and wherein, in each group, the one or more given pixels of said group have their third transistors connected to a same reading line.

In each group, the pixels are distributed into a single sub-group coincident with said group.

Each sub-group comprises a single given pixel.

The sensor (4) comprises, for each first column (C1, C8), exactly P reading lines (Vxi, Vx1, Vx2) associated with said first column, where P is a positive integer; and for each reading line (Vxi, Vx1, Vx2), the sensor (4) may include a reading circuit (200) connected to the reading line.

The groups (202) are arranged in second rows (RG1, RG8) and in second columns (CG1, CG8); the control circuit (400) is configured, in the first operating mode, to implement a simultaneous reading of the groups (202) of K second rows (RG1, RG8), where K is an integer belonging to a range from 2 to N*P; and in each second column (CG1, CG8), the third transistors (TS) of said given pixels (Pix3) of the groups (202) of said K second rows (RG1, RG8) are connected to different reading lines (Vxi, Vx1, Vx2) if they belong to different groups.

In each first row (R1, R8), all pixels (Pix3) of the row have their third transistors (TS) connected to a different reading line (Vxi, Vx1, Vx2).

The first rows (R1, R8) are arranged in sets of P first rows (R1, R8), and, in each set of P first rows (R1, R8), the third transistors (TS) of the pixels (Pix3) of a same first column (C1, C8) are connected to different reading lines (Vxi, Vx1, Vx2) among the P reading lines associated with said first column (C1, C8).

The control circuit (400) is configured, in a second operating mode, in each set of P first rows (R1, R8), to implement a simultaneous reading of the pixels (Pix3) of the P first rows of the set by controlling: the OFF state of the first transistor (TB) of each pixel (Pix3) of each said P first rows (R1, R8) of the set, and the ON state of the third transistor (TS) of each pixel (Pix3) of each said P first rows (R1, R8) of the set.

In the second operating mode, for each pixel (Pix3), the control circuit (400) is configured, for each integration phase by said pixel (Pix3), to control the OFF state of the first transistor (TB) of said pixel.

Each pixel further comprises a fourth transistor coupling the second node of said pixel to the first potential, the first potential being an initializing potential; and the control circuit (400) is configured, for each pixel (Pix3), to implement an initialization of the pixel (Pix3) by simultaneously controlling the ON state of the first and fourth transistors (TB, TR) of the pixel.

Each pixel (Pix3) comprises a transfer gate (TG) coupling the first node (SN) to the photosensitive element (PD), and wherein the control circuit (400) is configured, for each pixel (Pix3), to implement the initialization of the pixel (Pix3) by switching ON the transfer gate (TG) of the pixel, while the first and fourth transistors (TB, TR) of the pixel are in the ON state, and preferably, to switch OFF the transfer gate at the end of the initialization of the pixel.

In the first operating mode, in each group (202), the control circuit (400) is configured to implement an initialization of a first part of the pixels (Pix3) of the group, and an initialization of a second part of the pixels (Pix3) of the group (202) ending after the initialization of the first part of the pixels (Pix3) of the group (202).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor comprising:
an array of pixels arranged in first rows and in first columns, wherein:
the pixels are arranged in groups of N*N pixels, where N is an integer equal to or higher than 2;
in each of the groups, the pixels of the group are distributed into one or more sub-groups of a plurality of pixels; and
each pixel includes:
a photosensitive element,
a first node coupled to the photosensitive element,
a second node common to all pixels of a same sub-group, and coupled to a first potential,
a first transistor coupling the first and second nodes to each other,
a second transistor that is a source-follower transistor having a gate connected to the first node, and
a third transistor coupling the source of the second transistor to a reading line;
for each of the first columns, exactly P reading lines associated with the first column, where P is a positive integer;
for each of the reading lines, a reading circuit connected to the reading line; and
a control circuit configured, in a first operating mode, for each of the groups, to implement a reading of the group by controlling:
an ON state of the first transistor of each pixel of the group;
for each sub-group, an ON state of the third transistor of one or more given pixels from pixels of the sub-group, and an OFF state of the third transistor of remaining pixels from the pixels of the sub-group, wherein,
in each of the groups, the one or more given pixels of the group have their third transistors connected to a same reading line, wherein:
the groups are arranged in second rows and in second columns;
the control circuit is configured, in the first operating mode, to implement a concurrent reading of the groups of K second rows, where K is an integer belonging to a range from 2 to N*P; and
in each of the second columns, the third transistors of the one or more given pixels of the groups of the K second rows are connected to different reading lines if the third transistors belong to different groups.

2. The image sensor according to claim 1, wherein, in each of the groups, the pixels are distributed into a single sub-group coincident with the group.

3. The image sensor according to claim 1, wherein each sub-group includes a single given pixel.

4. The image sensor according to claim 1, wherein, in each of the first rows, all pixels of the first row have their third transistors connected to a different reading line.

5. The image sensor according to claim 1, wherein the first rows are arranged in sets of P first rows, and, in each set of P first rows, the third transistors of the pixels of a same first column are connected to different reading lines among the P reading lines associated with the first columns.

6. The image sensor according to claim 5, wherein the control circuit is configured, in a second operating mode, in each of the sets of P first rows, to implement a concurrent reading of the pixels of the P first rows of the set by controlling:
an OFF state of the first transistor of each pixel of each of the P first rows of the set, and
an ON state of the third transistor of each pixel of each of the P first rows of the set.

7. The image sensor according to claim 6, wherein, in the second operating mode, for each pixel, the control circuit is configured, for each integration phase by the pixel, to control the OFF state of the first transistor of the pixel.

8. The image sensor according to claim 1, wherein:
each pixel further includes a fourth transistor coupling the second node of the pixel to the first potential, the first potential being an initializing potential; and
the control circuit is configured, for each of the pixels, to implement an initialization of the pixel by simultaneously controlling an ON state of the first and fourth transistors of the pixel.

9. The image sensor according to claim 8, wherein:
each of the pixels includes a transfer gate coupling the first node to the photosensitive element; and
the control circuit is configured, for each of the pixels, to implement the initialization of the pixel by switching ON the transfer gate of the pixel, while the first and fourth transistors of the pixel are in the ON state, and to switch OFF the transfer gate at an end of the initialization of the pixel.

10. The image sensor according to claim 8, wherein, in the first operating mode, in each of the groups, the control circuit is configured to implement an initialization of a first part of the pixels of the group, and an initialization of a second part of the pixels of the group ending after the initialization of the first part of the pixels of the group.

11. A device comprising:
an image sensor including an array of pixels arranged in first rows, first columns, and a plurality of groups of pixels, each of the plurality of groups of pixels including a plurality of sub-groups of pixels, each pixel of the array of pixels including:
a first node;
a photodetector coupled to the first node;
a first transistor coupled to the first node;
a second node, the first transistor coupled between the first node and the second node, the second node of pixels included in the same sub-group of the plurality of sub-groups being coupled to each other;
a second transistor coupled to the first node; and
a third transistor coupled between the second transistor and a reading line; and
a control circuit coupled to the image sensor, the control circuit configured, in a first operating mode, for each of the groups, to implement a reading of the group by controlling:
an ON state of the first transistor of each pixel of the group;
for each sub-group, an ON state of the third transistor of one or more given pixels from pixels of the sub-group, and an OFF state of the third transistor of remaining pixels from the pixels of the sub-group;
for each of the first columns, P reading lines associated with the first column, where P is a positive integer; and

for each of the reading lines, a reading circuit connected to the reading line, wherein in each of the groups, the one or more given pixels of the group have their third transistors connected to a same reading line, and the first rows are arranged in sets of P first rows, and, in each set of P first rows, the third transistors of the pixels of a same first column are connected to different reading lines among the P reading lines associated with the first columns.

12. The device of claim 11, wherein the reading line is coupled to another third transistor of a pixel included in a different group of the plurality of groups, a different row of the array of pixels, and the same column of the array of pixels.

13. The device of claim 11, wherein the third transistor of pixels in the same group of the plurality of groups are coupled to different reading lines.

14. The device of claim 11 wherein the second transistor is a source-follower transistor.

15. An image sensor comprising:

an array of pixels arranged in first rows and in first columns, wherein:

the pixels are arranged in groups of N*N pixels, where N is an integer equal to or higher than 2;

in each of the groups, the pixels of the group are distributed into one or more sub-groups of a plurality of pixels; and each pixel includes:

a photosensitive element,

20 a first node coupled to the photosensitive element, a second node common to all pixels of a same sub-group, and coupled to a first potential that is an initializing potential, a first transistor coupling the first and second nodes to each other, a second transistor that is a source-follower transistor having a gate connected to the first node, a third transistor coupling the source of the second transistor to a reading line, and a fourth transistor coupling the second node to the first potential; and a control circuit configured to, for each of the pixels, to implement an initialization of the pixel by simultaneously controlling an ON state of the first and fourth transistors of the pixel.

16. The image sensor according to claim 15, wherein the control circuit is configured, in a first operating mode, for each of the groups, to implement a reading of the group by controlling:

an ON state of the first transistor of each pixel of the group;

for each sub-group, an ON state of the third transistor of one or more given pixels from pixels of the sub-group, and an OFF state of the third transistor of remaining pixels from the pixels of the sub-group, in each of the groups, the one or more given pixels of the group have their third transistors connected to a same reading line.

*    *    *    *    *